United States Patent
Lee et al.

(10) Patent No.: US 7,453,724 B2
(45) Date of Patent: *Nov. 18, 2008

(54) FLASH MEMORY DEVICE HAVING IMPROVED PROGRAM RATE

(75) Inventors: Aaron Lee, Mountain View, CA (US);
Hounien Chen, Fremont, CA (US);
Sachit Chandra, Sunnyvale, CA (US);
Nancy Leong, Sunnyvale, CA (US);
Guowei Wang, Cupertino, CA (US)

(73) Assignee: Spansion, LLC, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/931,992

(22) Filed: Oct. 31, 2007

(65) Prior Publication Data

US 2008/0049516 A1    Feb. 28, 2008

Related U.S. Application Data

(62) Division of application No. 11/212,850, filed on Aug. 29, 2005, now Pat. No. 7,307,878.

(51) Int. Cl.
*G11C 11/34* (2006.01)
*G11C 16/06* (2006.01)

(52) U.S. Cl. .................. 365/185.03; 365/185.18; 365/185.22; 365/185.24

(58) Field of Classification Search ............ 365/185.03, 365/185.17, 185.18, 185.2, 185.22, 185.24, 365/185.29, 185.33
See application file for complete search history.

(56) References Cited

U.S. PATENT DOCUMENTS

| | | |
|---|---|---|
| 5,291,446 A | 3/1994 | Van Buskirk et al. |
| 5,301,097 A | 4/1994 | McDaniel |
| 5,430,674 A | 7/1995 | Javanifard |
| 5,539,688 A | 7/1996 | Yiu et al. |
| 5,638,326 A | 6/1997 | Hollmer et al. |
| 5,751,637 A * | 5/1998 | Chen et al. ............. 365/185.33 |
| 5,890,192 A | 3/1999 | Lee et al. |

(Continued)

FOREIGN PATENT DOCUMENTS

WO    WO 03/063167 A2    7/2003

(Continued)

OTHER PUBLICATIONS

2002 IEEE International Solid-State Circuits Conference, Session 6, "SRAM and Non-Volatile Memories," Feb. 4, 2004, 6 pages.

(Continued)

*Primary Examiner*—Trong Phan
(74) *Attorney, Agent, or Firm*—Harrity & Harrity, LLP

(57) ABSTRACT

A method is provided for programming a nonvolatile memory device including an array of memory cells, where each memory cell including a substrate, a control gate, a charge storage element, a source region and a drain region. The method includes receiving a programming window that identifies a plurality of memory cells in the array. A first group of memory cells to be programmed is identified from the plurality of memory cells in the programming window. The first group of memory cells is programmed and a programming state of the first group of memory cells is verified.

19 Claims, 5 Drawing Sheets

U.S. PATENT DOCUMENTS

| | | |
|---|---|---|
| 5,892,710 A | 4/1999 | Fazio et al. |
| 6,044,022 A | 3/2000 | Nachumovsky |
| 6,101,125 A | 8/2000 | Gorman |
| 6,272,670 B1 | 8/2001 | Van Myers et al. |
| 6,295,228 B1 | 9/2001 | Pawletko et al. |
| 6,327,181 B1 | 12/2001 | Akaogi et al. |
| 6,424,570 B1 | 7/2002 | Le et al. |
| 6,426,893 B1 | 7/2002 | Conley et al. |
| 6,452,869 B1 | 9/2002 | Parker |
| 6,487,121 B1 | 11/2002 | Thurgate et al. |
| 6,496,410 B1 | 12/2002 | Parker |
| 6,535,419 B2 | 3/2003 | Parker et al. |
| 6,538,923 B1 | 3/2003 | Parker |
| 6,570,785 B1 | 5/2003 | Mangan et al. |
| 6,724,662 B2 | 4/2004 | Manea |
| 6,747,900 B1 | 6/2004 | Park et al. |
| 6,775,187 B1 | 8/2004 | Hamilton et al. |
| 6,816,001 B2 | 11/2004 | Khouri et al. |
| 6,894,929 B2 | 5/2005 | Matsuoka et al. |
| 6,952,366 B2 | 10/2005 | Forbes |
| 6,996,021 B2 | 2/2006 | Derner et al. |
| 7,020,018 B2 | 3/2006 | Hsieh et al. |
| 7,149,110 B2 | 12/2006 | Tran et al. |
| 7,151,701 B2 | 12/2006 | Combe et al. |
| 7,177,184 B2 | 2/2007 | Chen |
| 7,190,616 B2 | 3/2007 | Forbes et al. |
| 2001/0040836 A1 | 11/2001 | Mori et al. |
| 2002/0167844 A1 | 11/2002 | Han et al. |
| 2003/0093233 A1 | 5/2003 | Rajguru |
| 2003/0142544 A1 | 7/2003 | Maayan et al. |
| 2004/0027857 A1 | 2/2004 | Ooishi |
| 2004/0037113 A1 | 2/2004 | Ooishi |
| 2005/0232017 A1 | 10/2005 | Fujisawa et al. |

FOREIGN PATENT DOCUMENTS

WO  WO 2005/106891 A1  11/2005

OTHER PUBLICATIONS

2002 IEEE International Solid-State Circuits Conference, 29 pages.

Y. Wu et al., co-pending U.S. Appl. No. 11/212,614, filed Aug. 29, 2005, "Voltage Regulator with Less Overshoot and Faster Settling Time".

A. Lee et al., co-pending U.S. Appl. No. 11/212,850, filed Aug. 29, 2005, "Flash Memory Device Having Improved Program Rate".

* cited by examiner

FLASH MEMORY DEVICE HAVING IMPROVED PROGRAM RATE

RELATED APPLICATION

The present application is a divisional application of U.S. patent application No. 11/212,850, filed Aug. 29, 2005, now U.S. Pat. No. 7,307,878, the entire contents of which are incorporated by reference herein.

TECHNICAL FIELD

The present invention relates generally to non-volatile memory devices, and more specifically, to improving operations associated with non-volatile memory devices.

BACKGROUND ART

Flash memory is a common type of non-volatile semiconductor memory device. Non-volatile refers to the trait of retaining stored data when power is turned off. Because flash memory is non-volatile, it is commonly used in power conscious applications, such as in battery powered cellular phones, personal digital assistants (PDAs), and in portable mass storage devices such as memory sticks.

Flash memory devices typically include multiple individual components formed on or within a substrate. Such devices often include a high density section and a low density section. For example, a flash memory may include one or more high density core regions and a low density peripheral portion formed on a single substrate. The high density core regions typically include arrays of individually addressable, substantially identical floating-gate type memory cells. The low density peripheral portion may include input/output (I/O) circuitry, circuitry for selectively addressing the individual cells (such as decoders for connecting the source, gate and drain of selected cells to predetermined voltages or impedances to effect designated operations of the cell, such as programming, reading or erasing), and voltage regulation and supply circuitry.

In conventional flash memory architecture, memory cells within the core portion are coupled together in a circuit configuration in which each memory cell has a drain, a source, and a stacked gate. In operation, memory cells may be addressed by circuitry in the peripheral portion to perform functions such as reading, erasing, and programming of the memory cells. In a typical operation, flash memory cells may be programmed by a hot electron injection process that injects electrons from the channel region to the charge storage layer to create a negative charge within the charge storage layer. The electron injection may be performed by applying a drain-to-source bias along with a high positive voltage on the control gate. The high voltage on the control gate inverts the channel region while the drain-to-source bias accelerates electrons towards the drain region. The electrons are generally accelerated towards the drain region, with some of the electrons being re-directed toward the bottom oxide layer. The accelerated electrons gain enough kinetic energy to cross the bottom oxide layer and enter the charge storage layer. The charge storage layer stores the injected electrons within traps.

Once programmed, the charge storage layer stores charge for the memory cell. The negatively charged charge storage layer causes the threshold voltage of the memory cell to increase, which changes the magnitude of the current flowing between the source and the drain at various control gate voltages. Reading the programmed, or non-programmed, state of the memory cell may be based on the magnitude of the current flowing between the source and drain at a predetermined control gate voltage.

DISCLOSURE OF THE INVENTION

One aspect of the invention is directed to a method for programming a group of non-volatile memory cells in an array of non-volatile memory cells. The method includes programming the group of non-volatile memory cells; determining a programming state of each of the group of non-volatile memory cells; storing the programming states in a buffer; identifying non-programmed memory cells based on the programming states stored in the buffer; and reprogramming the non-programmed memory cells.

Another aspect is directed to a device including an array of non-volatile memory cells; logic to program a group of non-volatile memory cells in the array of non-volatile memory cells; logic to determine a programming state of each of the group of non-volatile memory cells; a buffer; logic to store the programming states in the buffer; logic to identify non-programmed memory cells in the group of non-volatile memory cells based on the programming states stored in the buffer; and logic to reprogram the non-programmed memory cells.

Yet another aspect is directed to a method including identifying a group of non-volatile memory cells in an array of non-volatile memory cells; performing a programming operation on the group of non-volatile memory cells; writing values corresponding to a programming state for each non-volatile memory cell in the group of non-volatile memory cells in a buffer; identifying non-programmed memory cells based on the programming states stored in the buffer; and performing a second programming operation on the non-programmed memory cells.

BRIEF DESCRIPTION OF THE DRAWINGS

Reference is made to the attached drawings, wherein elements having the same reference number designation may represent like elements throughout.

BEST MODE FOR CARRYING OUT THE INVENTION

Techniques described below relate to a flash memory programming technique in which program speed and power consumption is substantially reduced.

Memory Device Overview

Figure 1:
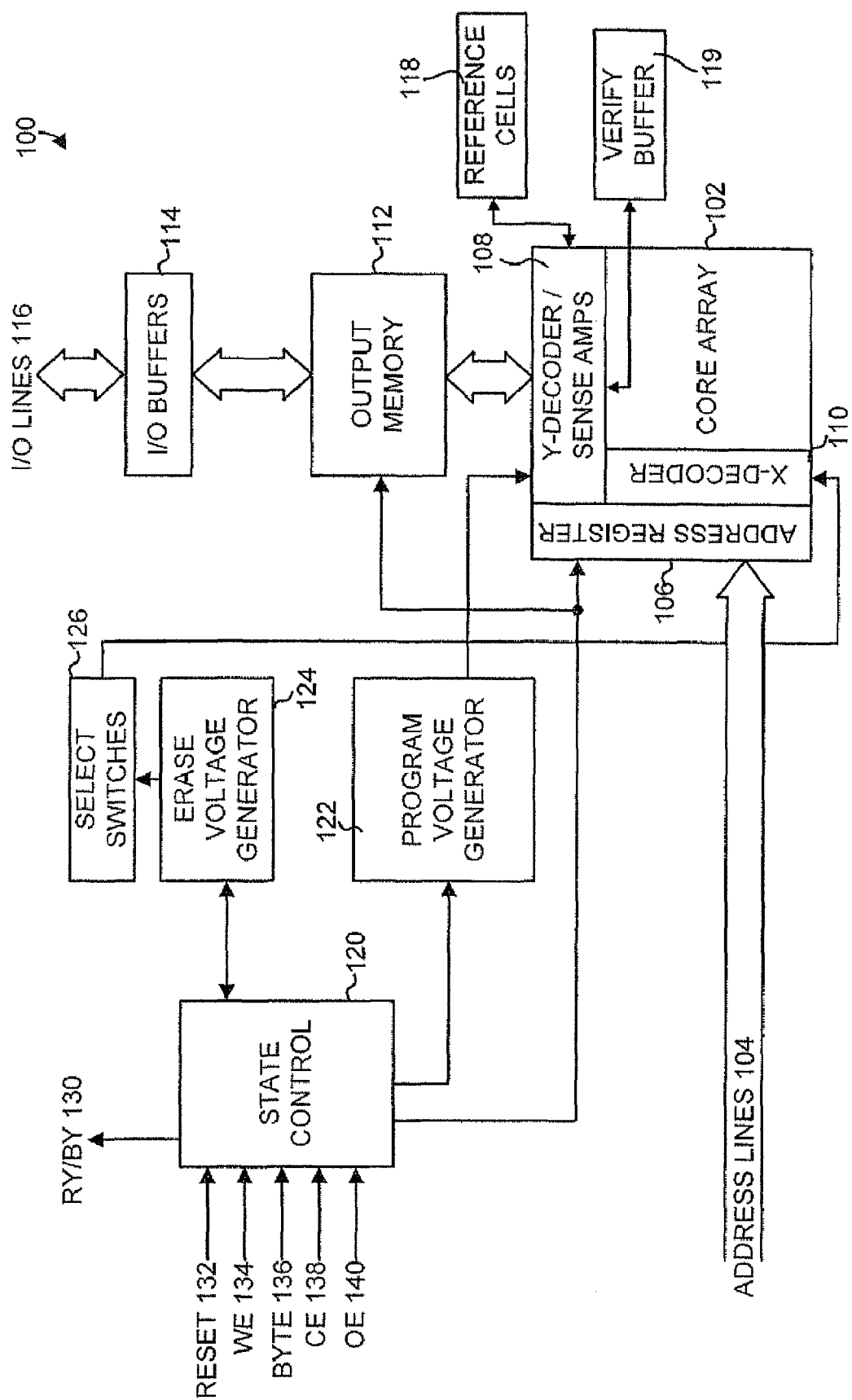
FIG. 1 is a block diagram illustrating an exemplary high-level implementation of a memory device.

FIG. 1 is a block diagram illustrating an exemplary high-level implementation of a memory device 100. Memory device 100 may be a flash memory device implemented as an integrated circuit.

As shown in FIG. 1, memory device 100 includes a core array 102. Core array 102 may include arrays of high density memory cells, such as, for example, SONOS-type (siliconoxide-nitride-oxide-silicon) NOR memory cells, where the nitride layer acts as the charge storage element. More specifically, core array 102 may include multiple M×N memory arrays of substantially identical memory cells. As will be discussed in more detail below, core array 102 may be a sequential access memory in which memory cells may be accessed in designated groups, such as pages. In this manner, core array 102 may adopt a NAND-like interface structure, regardless of the inherent NOR array structure contained within the memory device 100. Logically, pages can be thought of as blocks of data having predetermined sizes through which memory device 100 is accessed. In one implementation, the page size for memory device 100 is approximately two-thousand bytes (i.e., 2 kilobytes). Further, individual pages of data may be broken down into multiple rows within array 102. In one additional embodiment, a 2 kilobyte page of data may include four rows of 2,048 memory cells, each memory cell storing two bits of data.

Core array 102 may be accessed by providing an address for a page via address lines 104 to address register 106. Address register 106 may receive input address values and distribute them to Y-decoder 108 and X-decoder 110. Decoders 108 and 110 may decode the address values so that the source, gate, and drains of the memory cells referred to by the received addresses are activated and their data values read or programmed. The decoded addresses specify the appropriate physical lines in the memory cell array(s) that are to be used. For instance, a page of data may be activated and read out of core array 102 in parallel. The read data may be written to output memory 112 before being clocked to input/output (I/O) buffers 114 and read out via I/O lines 116. Y-decoder 108 may also include appropriate sense amplifier circuitry. Sense amplifier circuitry 108 may be used to sense the programmed or non-programmed state of the memory cells in core area 102 by comparing the threshold voltage of the memory cells to one or more reference cells 118. Results of this comparison may be stored in verify buffer 119.

In some implementations, the memory cells in array 102 may be implemented such that each memory cell can store two or more bits. In one such multi-bit per memory cell technology, called MirrorBit™, the intrinsic density of a flash memory array can be doubled by storing two physically distinct charges on opposite sides of a memory cell. Each charge, representing a bit within a cell serves as binary unit of data (e.g. either "1" or "0"). Reading or programming one side of a memory cell occurs independently of the data that is stored on the opposite side of the cell.

Output memory 112 may include static random access memory (SRAM) or dynamic random access memory (DRAM) type memory that can serve as a memory cache between core area 102 and I/O buffers 114. Output memory 112 may thus be a volatile memory (i.e., loses its data when powered down) and, relative to the memory cells in core array 102, may be a high speed memory.

As also shown in FIG. 1, memory device 100 can include a number of additional logic components that assist in reading/writing to core array 102. In particular, as shown, memory device 100 includes a state control component 120, a program voltage generator 122, an erase voltage generator 124, and select switches 126. These elements are shown in FIG. 1 as separate elements. It should be understood that the functions performed by two or more of these components may alternatively be performed by a single component.

State control component 120 may implement a state machine that dictates the function of memory device 100 based on a number of control signals, illustrated as the signals: reset line 132, write enable (WE) line 134, byte line 136, chip enable (CE) line 138, and output enable (OE) line 140. Reset line 132, when activated, causes a hardware reset of memory device 100. Write enable line 134 enables writing of data to core array 102. Byte line 136 selects the width of the output data bus. For example, byte line 136 may cause I/O lines 116 to function as an eight-bit data bus or a sixteen-bit data bus, depending on the state of byte line 136. Chip enable line 138 enables the reading/writing of data to memory device 100. When chip enable line 138 is held at its designated non-active level, the output pins of memory device 100 may be placed in a high impedance (non-active) state. To activate the memory device 100, chip enable line 138 may be held in its active state. Output enable line 140 enables reading of data from core array 102 and outputting the data via I/O lines 116.

Program voltage generator 122 and erase voltage generator 124 may generate the appropriate voltages needed for reading, writing, and erasing from/to core array 102. For example, in one implementation, core array 102 may require relatively high voltages to erase and program the memory cells in core array 102. These higher voltages may be provided from program voltage generator 122 and erase voltage generator 124. Select switches 126 may include select transistors connected to core array 102. Each select switch may be used to control a series of memory cells, such as a column of memory cells.

Also shown in FIG. 1 is ready/busy (RY/BY) line 130. Ready/busy line 130 may indicate when memory device 100 is performing an embedded program or erase operation. More specifically, when in the "busy" state, ready/busy line 130 indicates that memory device 100 is currently performing a program or erase operation. When in the "ready" state, ready/busy line 130 indicates that memory device 100 is not currently performing program or erase operation.

Figure 2:
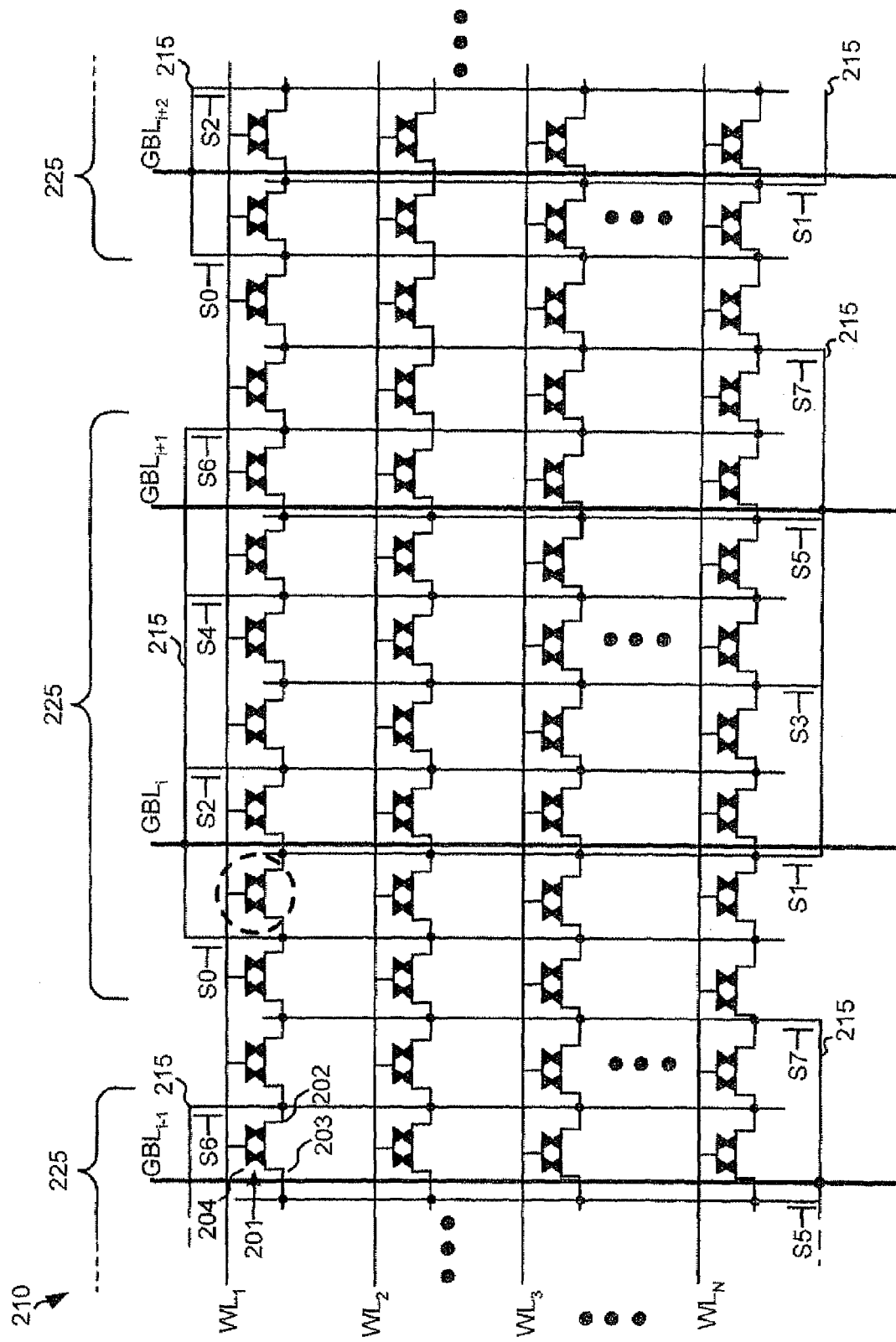
FIG. 2 is a diagram illustrating an exemplary portion of an array of memory cells implemented in the core area shown in FIG. 1.

FIG. 2 is a diagram illustrating an exemplary portion of an array of memory cells implemented in core area 102, labeled as memory array 210. The array includes a number of substantially identical memory cells 201. Each memory cell 201 includes a drain 202, a source 203, and a stacked gate region 204. Drain 202 and source 203 are interchangeable within a memory cell depending on the applied voltages and may be switched with respect to one another. The NOR configuration illustrated in FIG. 2 includes word lines (word lines $WL_1$ through $WL_N$) each connected to the gate region 204 of a number of memory cells in a row. Bit lines are arranged orthogonally to the word lines in array 210. The bit lines include global bit lines ($GBL_{i-1}$ through $GBL_{i+2}$) that each connect to one or more additional bit lines 215. Voltages placed on additional bit lines 215 via a global bit line GBL may be controlled through select transistors (also called select switches) S0 through S7.

As illustrated in FIG. 2, select transistors S0 through S7 may be arranged in repeating groups 225 of select transistors. Corresponding select transistors in a number of groups may be controlled by the same control signal. For example, activating select transistor S0 may connect the particular bit line connected to S0 to voltages applied to $GBL_i$, $GBL_{i+2}$, etc. If select transistor S1 was also activated, voltages applied to $GBL_{i+1}$, $GBL_{i+3}$, etc., would also be connected to the opposing source/drain of a number of memory cells in memory array 210. By also activating a word line WL, one memory cell in each group 225 may have its source, drain, and gate terminals all activated, thus allowing programming or reading of this select memory cell 201. As an example of selecting a particular memory cell 201 within a group 225 (e.g., the memory cell within the dotted circle in FIG. 2), assume that a voltage is placed on $WL_1$ and that S0 and S1 are turned-on and that voltages are placed on $GBL_i$ and $GBL_{i+1}$. At this point, this cell has voltages applied to its gate, source, and drain and may be programmed or read. Other memory cells 201 in other groups 225 can be simultaneously selected based on activation of the same WL and select transistors.

Although the memory cells 201 in core area 102 are shown as NOR memory cells, in some implementations, the circuitry in the peripheral regions of memory device 100 may provide an external interface that mimics an external interface normally provided by NAND-type flash memories. In this situation, memory device 100, from the point of view of the user/circuit designer, can effectively be thought of as a NAND-type flash device even though core area 102 includes NOR-type flash memory.

Although only four global bit lines and four word lines are shown in FIG. 2, one of ordinary skill in the art will recognize that a typical memory cell architecture will include many more cells in an array. For instance, in one implementation, core array 102 may include multiple memory cell arrays, each including 2048 bit lines and 256 word lines. The 2048 bit lines correspond to 256 eight memory cell groups 225 of select transistors.

Figure 3:
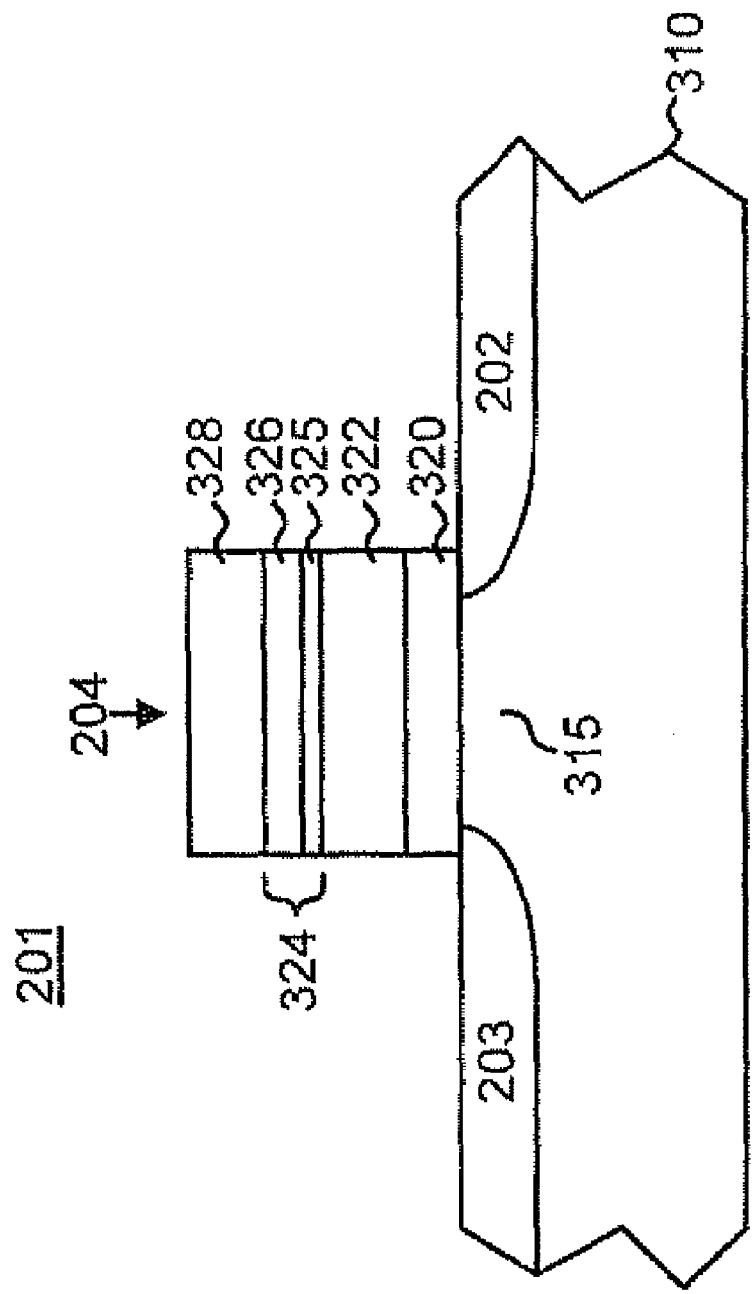
FIGS. 3 and 4 are diagrams illustrating a cross-section of an exemplary one of the memory cells shown in FIG. 2.

FIG. 3 is a diagram illustrating a cross-section of an exemplary one of memory cells 201 in more detail. Memory cell 201 may be formed on a substrate 310 and includes drain 202, source 203, and stacked gate 204. Substrate 310 may be formed of a semiconducting material such as silicon, germanium, or silicon-germanium. Drain and source regions 202 and 203 may be regions that are doped with n-type impurities, such as phosphorous or arsenic, or p-type impurities, such as boron. As previously mentioned, depending on the applied voltage values, the functions of drain and source regions 202 and 203 may be reversed.

As shown in FIG. 3, stacked gate 204 is formed on channel region 315. Stacked gate 204 includes a number of layers, including a relatively thin gate dielectric layer 320, a charge storage layer 322, a second dielectric layer 324, and a control gate 328. Dielectric layer 320 may include an oxide, such as a silicon oxide (e.g., $SiO_2$).

Charge storage layer 322 may be formed on gate dielectric layer 320 and may include a dielectric material, such as a nitride (e.g., a silicon nitride). Layer 322 acts as a charge storage layer for memory cell 201.

Charge storage layer 322 may be used to store one or more bits of information. In an exemplary implementation, charge storage layer 322 may store charges representing two separate bits of data by localizing the first and second charges to the respective left and right sides of charge storage layer 322. Each of the two charges of the memory cell 201 may be programmed independently by, for example, channel hot electron injection, to store a charge on each respective side of the charge storage layer 322. In this manner, the charges in charge storage layer 322 become effectively trapped on each respective side of charge storage layer 322 and the density of the resulting memory array may be increased as compared to memory devices that store only one bit of data per cell. In alternate implementations, charge storage layer 322 may store charges representing three or more bits of data for each memory cell 201.

Second dielectric layer 324 may be formed on layer 322 and may include a multi-layer structure, such as a first silicon oxide layer 325 and a second high dielectric constant (high-K) layer 326. High-K layer 326 may include, for example, an alumina, such as $Al_2O_3$. Dielectric layers 325 and 326 may together function as an inter-gate dielectric for memory cells 201. In alternate implementations, dielectric layer 324 may include a single layer, such as a silicon oxide or alumina.

Control gate 328 may be formed above second dielectric layer 324. Control gate 328 may be formed of, for example, polysilicon and may be connected to the word line of memory cell 201.

In operation, core area 102 of memory device 100 may be programmed by a channel hot electron injection process that injects electrons into charge storage layer 322. The injected electrons become trapped in charge storage layer 322 until an erase operation is performed.

Memory cells 201 in core array 102 may be programmed by applying a relatively high voltage (e.g., 7 volts) to one of the word lines WL, such as $WL_1$, which effectively applies the voltage to control gates 328 of the memory cells that are coupled to $WL_1$. Simultaneously, a voltage may be applied across drain 202 and source 203 of one of the memory cells in a group 225. For example, approximately five volts may be applied to $GBL_i$ and $GBL_{i+1}$ may be grounded. Also, select transistors S0 and S1 may be turned on by applying an appropriate voltage to S1. These voltages generate a vertical and lateral electric field in the activated memory cell(s) (e.g., the circled memory cell in FIG. 2) along the length of the channel from the source to the drain. These electric fields cause electrons to be drawn off the source and begin accelerating toward the drain. As they move along the length of the channel, they gain energy. If they gain enough energy, they can jump over the potential barrier of the dielectric layer 320 into one side of charge storage layer 322 and become trapped. The trapped electrons change the electrical properties of the memory cell. In a read operation, the source and drain terminals are interchanged. For example, the corresponding read operation may be performed by applying approximately three volts to $WL_1$, grounding $GBL_i$, and applying approximately 1.5 volts to $GBL_{i+1}$.

Figure 4:
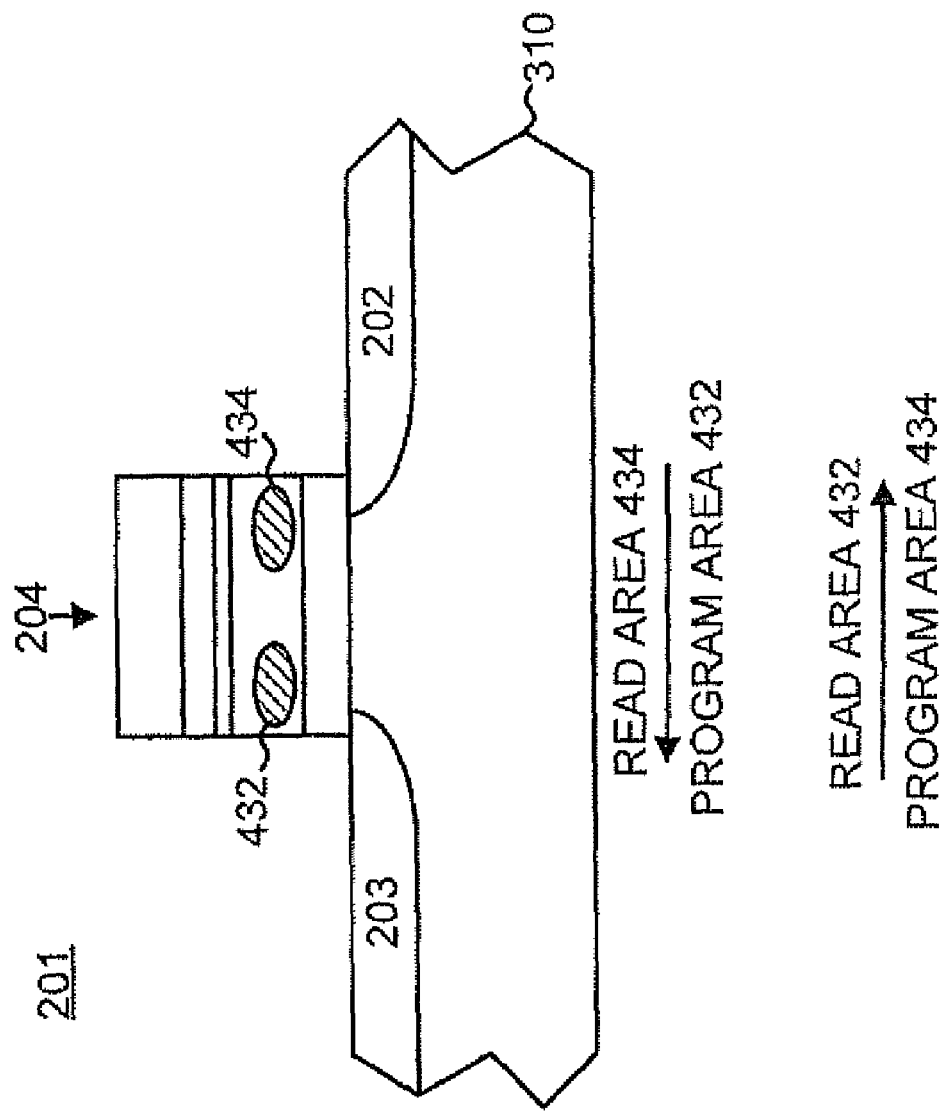

When two bits are stored in charge storage layer 322, the second bit is programmed in a manner similar to the first bit, except that the source and drain terminals are reversed in both directions. FIG. 4 is a diagram illustrating a cross-section of the exemplary memory cell shown in FIG. 3. Additionally, FIG. 4 illustrates read and program directions for when memory cell 201 is used to store charges representing two independent bits. Memory cell 201 includes two separate charge storage areas 432 and 434 within charge storage layer 322. Each storage area 432 and 434 may define one bit. To program the left area 432 or read the right area 434, area 203 acts as the drain and receives a high voltage relative to area 202, which acts as the source. To program the right area 434 or read the left area 432, area 202 acts as the drain and receives a high voltage relative to area 203, which acts as the source. The arrows in FIG. 4 graphically illustrate the direction of charge flow.

MEMORY DEVICE PROGRAM AND PROGRAM VERIFY OPERATIONS

In a conventional NOR-type memory cell programming operation, each memory cell to be programmed is subjected to alternating program and verify operations. For example, a programming pulse constituting appropriate source, drain and control gate voltages may be applied to a memory cell 201 for a predetermined period of time. Following application of the programming pulse, a program verify operation may be performed during which the threshold voltage ($V_t$) of memory cell 201 is compared against a reference threshold voltage using sense amplifier circuitry 108.

By comparing the threshold voltage of the memory cell 201 against a reference threshold voltage, a determination can be made as to whether the memory cell 201 has been programmed to the desired program level. In some implementations, this determination may be made my monitoring or sensing the drain to source current through memory cell 201. If it is determined that the threshold voltage is greater than or equal to the reference voltage, the programming is considered completed. However, if it is determined that the threshold voltage is less than the reference voltages, one or more additional program pulses may be applied until the desired program level is achieved.

Because traditional program operations require alternate application of programming and verification processes until all memory cells to be programmed are verified, voltages applied to the control gates along a word line (e.g., $WL_1$) must be continually transitioned from a program voltage to a verify voltage. Accordingly, during programming of a page of data in core array 102, each memory cell 201 along a word line (e.g., $WL_1$) associated with the page are alternately programmed and verified using different voltages applied along the word line. Each voltage transition takes a certain amount of time, ranging from for example, from about 1.2 µs to about 3.2 µs.

Figure 5:
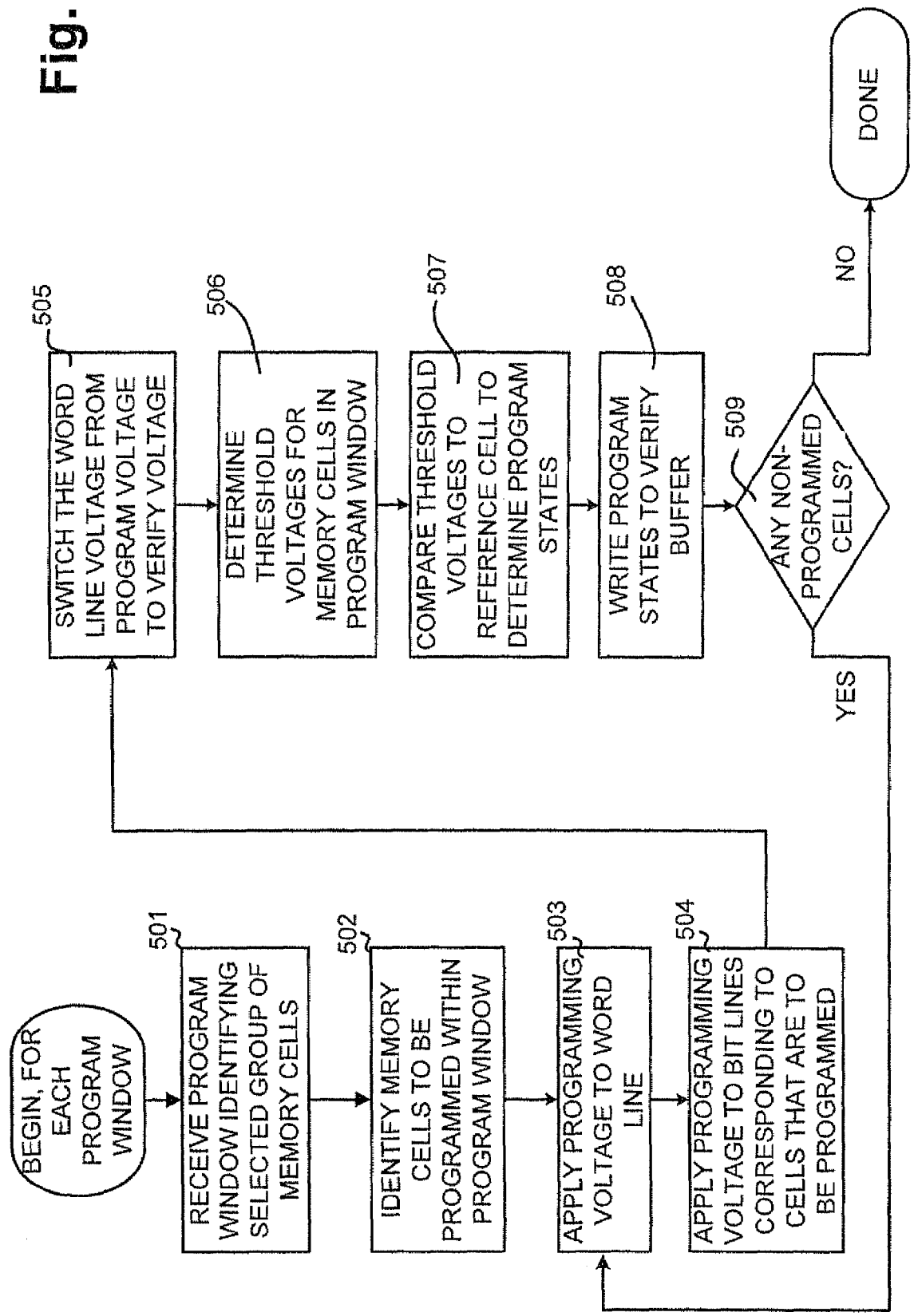
FIG. 5 is a flow chart illustrating exemplary programming and program verifying of a memory device such as the memory device shown in FIG. 1.

FIG. 5 is a flow chart illustrating exemplary programming and program verifying of a memory device such as memory device 100 in accordance with principles of the invention. Initially, a program window may be received that identifies a selected group of memory cells (act 501). In an exemplary implementation, a program window may include all or any portion of the memory cells (e.g, 2,048 memory cells) along a selected word line (e.g., $WL_1$). For each program window to be written, logic in memory device 100, such as, for example, logic in Y-decoder 108 or state control component 120, may determine which memory cells 201 in the selected program window require programming (act 502).

The word line corresponding to the selected program window may next be activated by applying a relatively high voltage to the word line (act 503). Such a voltage may range from about 9 volts to about 9.5 volts during normal program operation and from about 4.5 volts to 5 volts for a pre- or soft program operation. Also, the bit lines (e.g., drain 203/202) corresponding to the memory cells 201 that are to be programmed may then be activated by pulsing the bit lines to a bit line voltage (act 504). In one implementation, the bit line voltage may range from about 4.2 volts to about 5.1 volts for normal program operation and from about 3.5 volts to about 4 volts for pre- or soft program operation. In this implementation, the source region 202/203 may be floated to 0 volts (i.e., grounded). It should be noted that not all of the memory cells 201 in the selected program window may actually need to be programmed. The select transistors S0-S7 for any memory cells 201 that do not need to be programmed may remain in the "off" state (i.e., non-activated). That is, no voltage may be applied to the gates of the select transistors S0-S7 for each of the memory cells 201 that do not need to be programmed.

Following programming of the memory cells 201 designated by the program window, a program verify process may be performed to ensure that the programming voltages applied to each memory cell 201 have adequately raised the threshold voltage for the memory cells 201 to be programmed up to or above a predetermined reference voltage to actually program the appropriate memory cells 201. In one implementation consistent with principles of the invention, multiple program windows may be verified as a group. More specifically, 274-bits may be verified during one verify operation. Following verification of one program window, the process may repeat until all memory cells along the word line have been programmed and verified.

In accordance with principles of the invention, the program verify process may include switching the word line voltage from a program voltage to a read or verify voltage (act 505). Next, the program state of each memory cell 201 in the program window may be determined. In one implementation consistent with the invention, an entire word line of memory cells 201 in array 102 (e.g., 2,048 memory cells) may be program verified, while in an alternative implementation fewer numbers of memory cells 201 may be program verified. In one exemplary embodiment, the program verify process may include sensing a threshold voltage ($V_t$) or drain to source current ($I_{ds}$) on each bit line associated with the program window using a number of discrete sense amplifiers included within Y decoder/sense amplifier circuitry 108 (act 506). For example, if 256 memory cells are to be parallel verified, 256 sense amplifiers may be used.

The measured threshold voltages (or drain to source currents) are then compared against a reference threshold voltage (or drain to source current) associated with reference cell 118 to determine the program state of each memory cell (act 507). Memory cells 201 having threshold voltages greater than the appropriate reference threshold voltage are considered to be programmed, while memory cells 201 having threshold voltages lower than the appropriate reference threshold voltage are considered to be non-programmed or under-programmed. The program state of each cell 201 may then be written to, for example, an array in verify buffer 119 (act 508). It is then determined, based on the program states stored in verify buffer 119, whether memory cells 201 to be programmed remain in a non-programmed state (act 509) and the process returns to acts 503 and 504 for application of an additional programming pulse to the identified non-programmed cells 201. The verify process of acts 505-508 is then repeated until all memory cells 201 are determined to be appropriately programmed.

By performing the program verify operation on an entire program window (e.g., entire word line $WL_1$), the number of word line voltage transitions between programming and verify voltages are significantly reduced. Furthermore, by writing the results of word line verification to verify buffer 119 and applying subsequent program pulses to only those memory cells 201 determined to be non-programmed, over-programming of previously programmed memory cells may be advantageously prevented. Also, as the length of the program window or word line increases due to increased numbers of memory cells 201, the time taken to ramp up to the programming voltage may be substantial. By reducing the number of times the word line is ramped up, additional time savings may be obtained.

CONCLUSION

As described above, a number of programming techniques, such as parallel processing and program window verify operations may be performed to substantially increase programming speed in a NOR-based memory device.

The foregoing description of exemplary embodiments of the invention provides illustration and description, but is not intended to be exhaustive or to limit the invention to the precise form disclosed. Modifications and variations are possible in light of the above teachings or may be acquired from practice of the invention.

Moreover, while series of acts have been described with regard to FIG. 5, the order of the acts may be varied in other implementations consistent with the invention. Moreover, non-dependent acts may be implemented in parallel.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed:

1. A method for programming a group of non-volatile memory cells in an array of non-volatile memory cells, comprising:
   receiving a programming window that identifies a plurality of memory cells in the array of non-volatile memory cells, where the programming window identifies fewer than one half of a total number of non-volatile memory cells in a row of memory cells in the array or more than one half of the total number of non-volatile memory cells in the row of memory cells in the array;
   identifying a group of non-volatile memory cells to be programmed from the plurality of memory cells in the programming window;
   programming the group of non-volatile memory cells;
   determining a programming state for each memory cell in the group of non-volatile memory cells;
   storing, in a buffer, the programming state for each memory cell in the group of non-volatile memory cells;
   identifying non-programmed memory cells in the group of non-volatile memory cells based on the programming state for each memory cell in the group of non-volatile memory cells stored in the buffer; and
   reprogramming the non-programmed memory cells.

2. The method of claim 1, wherein programming the group of non-volatile memory cells comprises applying programming voltage pulses to the group of non-volatile memory cells.

3. The method of claim 2, wherein determining the programming state for each of the group of non-volatile memory cells comprises sensing a threshold voltage in each of the group of non-volatile memory cells, where memory cells having a threshold voltage lower than a reference threshold voltage are non-programmed and memory cells having a threshold voltage greater than or equal to the reference threshold voltage are programmed.

4. The method of claim 1, further comprising:
   writing, to the buffer, a value indicative of the programmed state for each memory cell in the group of non-volatile memory cells.

5. The method of claim 1, wherein determining the programming state of each of the group of non-volatile memory cells comprises:
   verifying the programming state of each of the group of non-volatile memory cells.

6. The method of claim 1, wherein the determining the programming state of each of the group of non-volatile memory cells comprises simultaneously verifying the programming state for each of up to 2,048 memory cells.

7. The method of claim 1, wherein the array of non-volatile memory cells include SONOS (silicon-oxide-nitride-oxide-silicon) type NOR memory cells.

8. The method of claim 1, where each memory cell comprises a substrate, a control gate, a charge storage element, a source region and a drain region, and wherein the charge storage element comprises a dielectric charge storage element configured to store at least two independent charges for each memory cell.

9. The method of claim 8, wherein programming the group of non-volatile memory cells comprises:
   applying a first voltage to a control gate of each of the group of non-volatile memory cells; and
   applying a second voltage to a drain region of each of the group of non-volatile memory cells.

10. The method of claim 9, where determining the programming state for each of the group of non-volatile memory cells comprises:
    applying a third voltage to the control gate of each of the group of non-volatile memory cells; and
    monitoring a threshold voltage in each memory cell in the group of non-volatile memory cells.

11. The method of claim 10, wherein the third voltage is different from the first voltage.

12. A device, comprising:
    an array of non-volatile memory cells;
    a state control component for receiving a programming window that identifies a plurality of memory cells in the array of non-volatile memory cells, where the programming window identifies fewer than one half of a total number of non-volatile memory cells in a row of memory cells in the array or more than one half of the total number of non-volatile memory cells in the row of memory cells in the array,
    where the state control component identifies a group of non-volatile memory cells to be programmed from the plurality of memory cells in the programming window,
    where the state control component is configured to program the group of non-volatile memory cells in the array of non-volatile memory cells;
    sense amplifier circuitry to determine a programming state of each of the group of non-volatile memory cells; and
    a buffer,
    wherein the sense amplifier circuitry is further configured to:
      store, in the buffer, the programming state for each memory cell in the group of non-volatile memory cells, and
    identify non-programmed memory cells in the group of non-volatile memory cells based on the programming states stored in the buffer, and
    wherein the state control component is further configured to reprogram the non-programmed memory cells.

13. The device of claim 12, wherein the array of non-volatile memory cells comprise:
    a plurality of bit lines each connected to source or drain regions of a plurality of the non-volatile memory cells; and
    a plurality of word lines, arranged orthogonally to the bit lines, each word line being connected to gate regions of a plurality of the non-volatile memory cells,
    wherein the group of non-volatile memory cells corresponds to the non-volatile memory cells along a selected word line.

14. The device of claim 12, comprising:
    a voltage supply component configured to generate at least one programming voltage for programming the group of non-volatile memory cells and a verifying voltage for identifying the non-programmed memory cells in the group of non-volatile memory cells,
    wherein the at least one programming voltage and the verifying voltage comprise different voltages.

15. The device of claim 14, where the state control component is further configured to:

apply a first programming voltage to a control gate of each non-volatile memory cell in the group of non-volatile memory cells; and apply a second programming voltage to a drain region of each non-volatile memory cell in the group of non-volatile memory cells.

16. The device of claim 14, where the sense amplifier circuitry is further configured to:

apply the verifying voltage to the control gate of each non-volatile memory cell in the group of non-volatile memory cells; and compare a threshold voltage in each memory cell in the group of non-volatile memory cells to a threshold voltage of at least one reference memory cell.

17. The device of claim 12, where each non-volatile memory cell in the array of non-volatile memory cells comprises:

a substrate;
a control gate;
a charge storage element;
a source region; and
a drain region,
wherein the charge storage element comprises a dielectric charge storage element configured to store at least two independent charges for each non-volatile memory cell.

18. A method, comprising:

receiving a programming window that identifies a plurality of memory cells in the array of non-volatile memory cells, where the programming window identifies fewer than one half of a total number of non-volatile memory cells in a row of memory cells in the array or more than one half of the total number of non-volatile memory cells in the row of memory cells in the array;

identifying a group of non-volatile memory cells in an array of non-volatile memory cells;

performing a programming operation on the group of non-volatile memory cells;

writing, to a buffer, values corresponding to programming states for each non-volatile memory cell in the group of non-volatile memory cells;

identifying non-programmed memory cells based on the programming states stored in the buffer; and performing a second programming operation on the non-programmed memory cells.

19. The method of claim 18, comprising:

writing values corresponding to the programming states for each of the non-programmed memory cells, following performing the second programming operation, in the buffer;

identifying remaining non-programmed memory cells based on the programming states stored in the buffer; and performing a third programming operation on the remaining non-programmed memory cells.

* * * * *